United States Patent
Lim et al.

(10) Patent No.: US 7,675,316 B2
(45) Date of Patent: Mar. 9, 2010

(54) SEMICONDUCTOR MEMORY DEVICE INCLUDING ON DIE TERMINATION CIRCUIT AND ON DIE TERMINATION METHOD THEREOF

(75) Inventors: Jong-Hyoung Lim, Hwaseong-si (KR); Sang-Seok Kang, Suwon-si (KR)

(73) Assignee: Samsung Electronics, Co., Ltd. (KR)

( * ) Notice: Subject to any disclaimer, the term of this patent is extended or adjusted under 35 U.S.C. 154(b) by 440 days.

(21) Appl. No.: 11/429,365

(22) Filed: May 5, 2006

(65) Prior Publication Data
US 2007/0030025 A1 Feb. 8, 2007

(30) Foreign Application Priority Data
Aug. 5, 2005 (KR) .................. 10-2005-071750

(51) Int. Cl.
*H03K 17/16* (2006.01)
(52) U.S. Cl. .................. 326/30; 326/86; 326/87
(58) Field of Classification Search ............ 326/30, 326/108; 327/170, 172–176
See application file for complete search history.

(56) References Cited

U.S. PATENT DOCUMENTS

| 6,262,606 B1* | 7/2001 | Tamjidi | 327/108 |
|---|---|---|---|
| 2002/0118037 A1* | 8/2002 | Kim et al. | 326/30 |
| 2004/0032319 A1 | 2/2004 | Kyung | 338/320 |
| 2004/0085088 A1* | 5/2004 | Marshall et al. | 326/29 |
| 2004/0100837 A1* | 5/2004 | Lee | 365/200 |
| 2004/0174185 A1* | 9/2004 | Lin et al. | 326/30 |
| 2005/0212552 A1* | 9/2005 | Chung | 326/30 |
| 2005/0253635 A1* | 11/2005 | Hargan | 327/170 |
| 2006/0044008 A1* | 3/2006 | Miyake et al. | 326/30 |

FOREIGN PATENT DOCUMENTS

| JP | 11-102232 | 4/1999 |
|---|---|---|
| JP | 2003-223784 | 8/2003 |
| JP | 2004-310981 | 11/2004 |
| KR | 1996-0002006 | 9/1996 |
| KR | 1020030032831 | 4/2003 |
| KR | 1020040043995 | 5/2004 |

* cited by examiner

*Primary Examiner*—James H. Cho
*Assistant Examiner*—Jany Tran
(74) *Attorney, Agent, or Firm*—Mills & Onello, LLP

(57) ABSTRACT

A semiconductor memory device is provided. The device includes an on die termination circuit controlling a termination resistance value by detecting a phase change of a signal inputted through a pad. Additionally, the on die termination circuit changes the termination resistance value when an identical phase signal is inputted during n (n is positive integer) periods of a clock signal.

20 Claims, 6 Drawing Sheets

Fig. 6
(PRIOR ART)
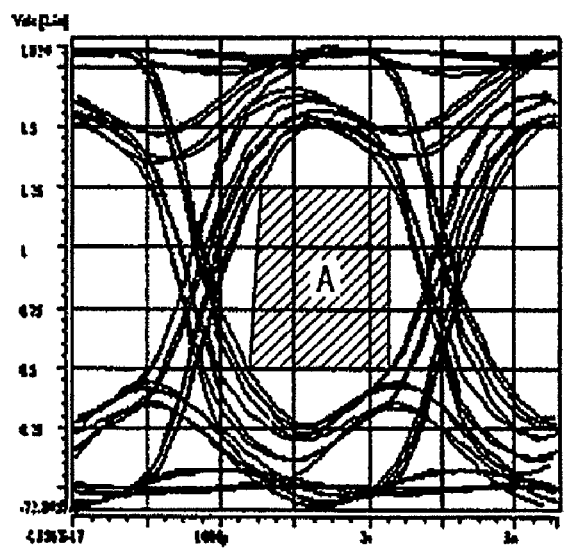
(a)
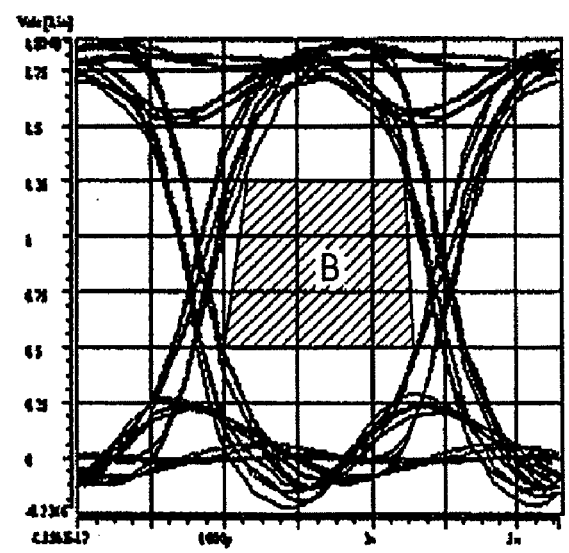
(b)

SEMICONDUCTOR MEMORY DEVICE INCLUDING ON DIE TERMINATION CIRCUIT AND ON DIE TERMINATION METHOD THEREOF

RELATED APPLICATION

This application relies for priority on Korean Patent Application No. 10-2005-0071750, filed on Aug. 5, 2005, in the Korean Intellectual Property Office, the contents of which are incorporated herein in their entirety by reference.

BACKGROUND OF THE INVENTION

1. Field of the Invention

The present invention relates to a semiconductor memory device, and more particularly, to a semiconductor memory device including an on die termination circuit and an on die termination method thereof.

2. Description of the Related Art

Generally, a semiconductor memory device is a storage device for storing data and, if necessary, the stored data is read. Semiconductor memory devices can be largely classified as random access memory (RAM) or read only memory (ROM). The RAM is a volatile memory device in which stored data is lost when power is turned off. The ROM is nonvolatile memory device in which stored data is retained even if power is turned off. RAM includes dynamic RAM (DRAM), static RAM (SRAM), etc. The ROM includes programmable ROM (PROM), erasable PROM (EPROM), electrically EPROM (EEPROM), flash memory, etc.

The semiconductor memory device receives a signal from the outside through a pad. The semiconductor memory device includes an on die termination ODT circuit terminating a data line for an impedance matching. The ODT circuit increases signal integrity by controlling signal reflection using a termination resistance device.

A conventional on die termination circuit has a predetermined termination resistance value regardless of phase change. The termination resistance value of the on die termination circuit is determined by a value stored on a mode register MRS during an initial operation. However, the conventional on die termination circuit cannot always effectively deal with inter symbol interference (ISI) according to various phase changes because of always having a predetermined termination resistance value.

For example, it will be assumed that a data phase is a first case (low-high-low-high) or a second case (low-low-low-high). Termination resistance values of the first case and the second case are identical, but an influence of the ISI is different. Since the influence of the ISI is different, the first case and the second case have different signal transmission characteristics to each other. This causes window characteristics of an effective input signal to be decreased.

That is, the conventional semiconductor memory device determines the termination resistance value of the on die termination circuit by a value stored in a mode register during an initial operation. Accordingly, there is a problem that the conventional semiconductor memory device cannot deal with the ISI influence.

SUMMARY OF THE INVENTION

The present invention provides a semiconductor memory device including an on die termination circuit and an on die termination method thereof capable of reducing the ISI influence by changing the termination resistance value according to a phase change of an input signal.

According to a first aspect, the present invention is directed to a semiconductor memory device including an on die termination circuit controlling a termination resistance value by detecting a phase change of a signal inputted through a pad.

In one particular embodiment, the on die termination circuit changes the termination resistance value when an identical phase signal is inputted during n (n is positive integer) periods of a clock signal. In one embodiment, the pad is a data pad.

In some embodiments, the on die termination circuit includes a pull-up resistance unit having a pull-up termination resistance value and a pull-down resistance unit having a pull-down termination resistance value, and the pull-up termination resistance value and the pull-down termination resistance value can be controlled independently. The on die termination circuit can further comprise a pull-up resistance controller controlling the pull-up termination resistance value by detecting the phase change of the signal, and a pull-down resistance controller controlling the pull-down termination resistance value by detecting the phase change of the signal. In one embodiment, the pull-up resistance controller changes the pull-up termination resistance value when an identical phase signal is inputted during n (n is positive integer) periods of a clock signal. In one embodiment, the pull-up resistance controller reduces the pull-up termination resistance value when a low level signal is inputted during n (n is positive integer) periods of the clock signal. In one embodiment, the pull-down resistance controller changes the pull-down termination resistance value when an identical phase signal is inputted during n (n is positive integer) periods of a clock signal. In one embodiment, the pull-down resistance controller reduces the pull-down termination resistance value when a low level signal is inputted during n (n is positive integer) periods of the clock signal.

The on die termination circuit can further include a switch unit turning on or off the die termination circuit in response to a control signal, e.g., ODT_ON, supplied from a mode register.

According to another aspect, the invention is directed to a semiconductor memory device including a plurality of on die termination circuits controlling a terminal resistance value independently by detecting each phase change of signals inputted through a plurality of pads.

In one embodiment, the plurality of pads are a plurality of data pads.

In one embodiment, each of the on die termination circuits includes a pull-up resistance unit having a pull-up termination resistance value and a pull-down resistance unit having a pull-down termination resistance value, and the pull-up termination resistance value and the pull-down termination resistance value can be controlled independently.

In one embodiment, each of the on die termination circuits includes: a pull-up resistance unit having a pull-up termination resistance value; a pull-down resistance unit having a pull-down termination resistance value; a switch unit connected between the pull-up resistance unit and the pull-down resistance unit to turn on or off the plurality of die termination circuits in response to a control signal ODT_ON supplied from a mode register; a pull-up resistance controller controlling the pull-up termination resistance value by detecting a phase change of data; and a pull-down resistance controller controlling the pull-down termination resistance value by detecting the phase change of the data. In one embodiment, the pull-up resistance controller changes the pull-up termination resistance value when a low level data is inputted during n (n is positive integer) periods of a clock signal. In one embodiment, the pull-down resistance controller changes the pull-down termination resistance value when a high level data is inputted during n (n is positive integer) periods of a clock signal.

In one embodiment, the semiconductor memory device is a dynamic random access memory (DRAM) drvice.

According to another aspect, the invention is directed to an on die termination method of a semiconductor memory device including detecting a phase change of a signal inputted from a pad; and controlling a termination resistance value of an on die termination circuit.

In one embodiment, the termination resistance value is changed when an identical phase signal is inputted during n (n is positive integer) periods of a clock signal. In one embodiment, the on die termination circuit comprises a pull-up termination resistance value and a pull-down termination resistance value, and the pull-up termination resistance value and the pull-down termination resistance value are controlled independently.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

FIG. 6 is a graph illustrating a data window diagram.

DETAILED DESCRIPTION OF THE INVENTION

Figure 1:
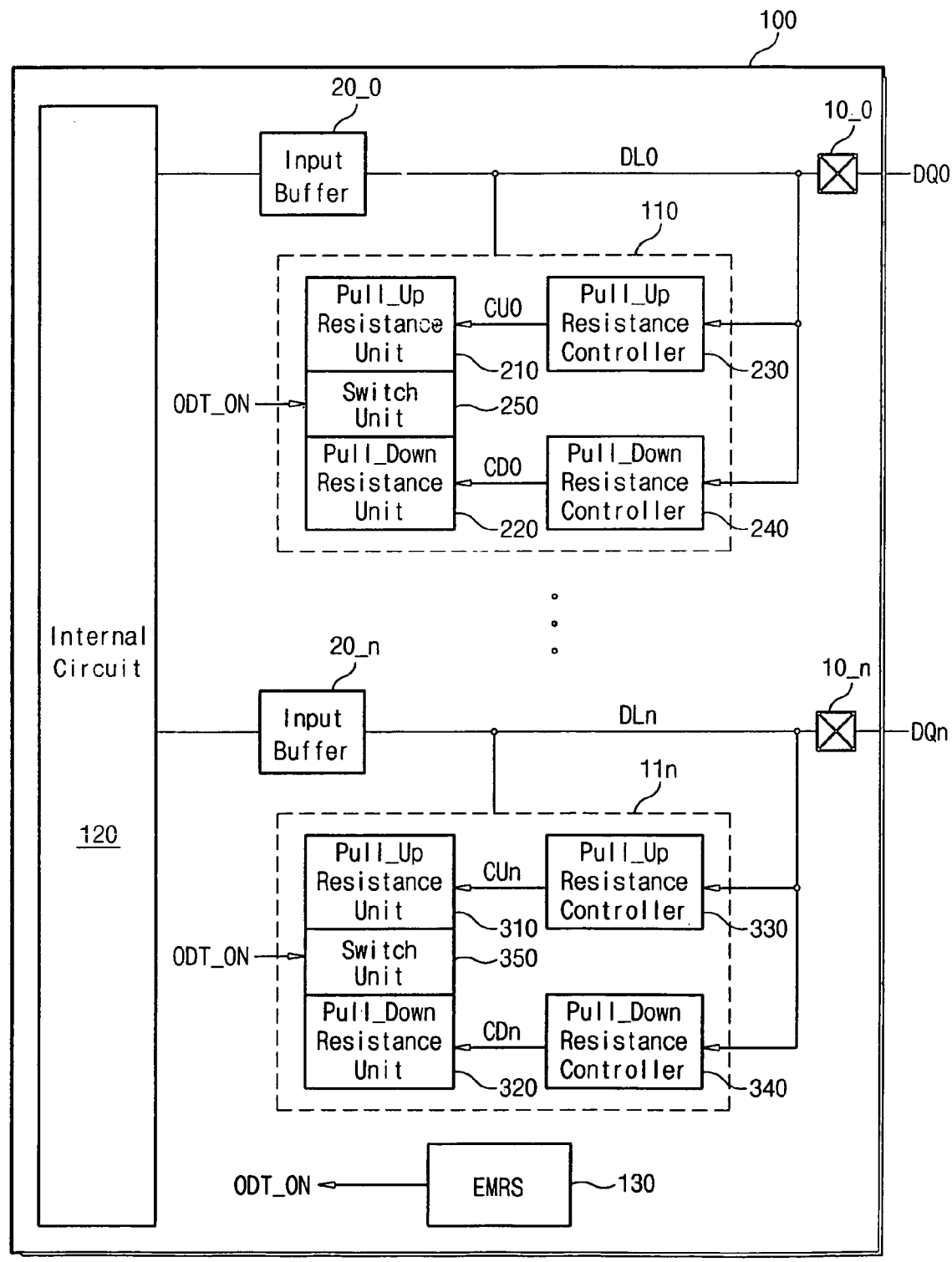
FIG. 1 is a block diagram of a semiconductor memory device according to an embodiment of the present invention.

FIG. 1 is a block diagram of a semiconductor memory device according to an embodiment of the present invention. Referring to FIG. 1, the semiconductor memory device 100 includes a plurality of pads (10_i; i=0 to n), a plurality of input buffers (20_i; i=0 to n), a plurality of on die termination circuits (110 to 11n), an internal circuit 120, and a mode register EMRS 130. Here, each of the pads, each of the input buffers, and each of the on die termination circuits have an identical configuration and an operational principle. Hereinafter, the pad 10_0, the input buffer 20_0, and the on die termination circuit 110 are mainly described in more detail.

The pad 10_0 receives data DQ0 through a data pin. The input buffer 20_0 is connected to the pad 10_0 through a data line DL0. The input buffer 20_0 buffers the data DQ0, and transmits the buffered data DQ0 to the internal circuit 120. The internal circuit 120 includes a memory cell array, a decoder, a writing driver, and a sense amplifier. The internal circuit 120 programs the data of the input buffer 20_0 to the memory cell.

The on die termination circuit 110 is connected to the data line DL0. The on die termination circuit 110 controls a termination resistance value by detecting a phase change of the data DQ0 inputted through the pad 10_0. The on die termination circuit 110 changes the termination resistance value when data of an identical phase is inputted during n (n is a positive integer) periods of a clock signal.

Referring to FIG. 1, the on die termination circuit 110 includes a pull-up resistance unit 210, a pull-down resistance unit 220, a pull-up resistance controller 230, a pull-down resistance controller 240, and a switch unit 250. The pull-up resistance unit 210 is connected between a power terminal (not shown) and the switch unit 250, and has a pull-up termination resistance value. The pull-down resistance unit 220 is connected between a ground terminal (not shown) and the switch unit 250, and has a pull-down termination resistance value.

The pull-up resistance controller 230 supplies a pull-up control signal CU0, which controls the pull-up termination resistance value, to the pull-up resistance unit 210 by detecting a phase change of the data DQ0. The pull-up resistance controller 230 changes a pull-up termination resistance value when data of an identical phase is inputted during n periods of a clock signal. For example, the pull-up resistance controller 230 generates the pull-up control signal CU0 to reduce the pull-up termination resistance value when a low level signal is inputted during three periods of the clock signal.

The pull-down resistance controller 240 supplies a pull-up control signal CD0, which controls the pull-down termination resistance value, to the pull-down resistance unit 220 by detecting a phase change of the data DQ0. The pull-down resistance controller 240 changes a pull-down termination resistance value when data of an identical phase is inputted during n periods of a clock signal. For example, the pull-down resistance controller 240 generates the pull-down control signal CD0 to reduce the pull-up termination resistance value when a high level signal is inputted during three periods of the clock signal.

The switch unit 250 turns on or off the on die termination circuit 110 in response to a control signal ODT_ON supplied from the mode register EMRS. The switch unit 250 is located between the pull-up resistance unit 210 and the pull-down resistance unit 220. However, the switch unit 250 can be located between a power terminal and the pull-up resistance unit 210, or a ground terminal and the pull-down resistance unit 220.

Figure 2:
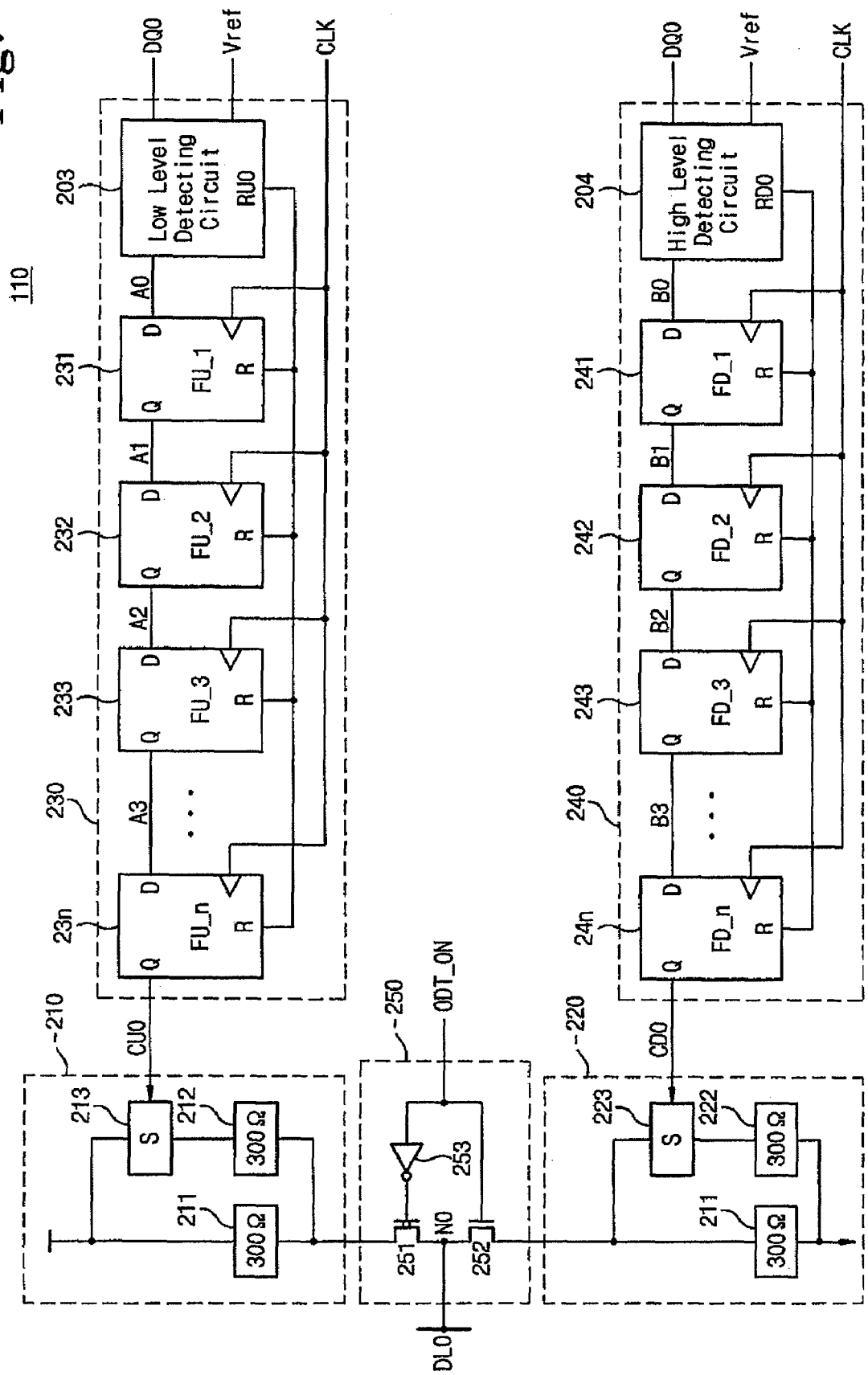
FIG. 2 is a circuit diagram of an on die termination circuit illustrated in FIG. 1.

FIG. 2 is a circuit diagram of an on die termination circuit illustrated in FIG. 1. Referring to FIG. 2, an on die termination circuit 110 includes a pull-up resistance unit 210, a pull-down resistance unit 220, a pull-up resistance controller 230, a pull-down resistance controller 240, and a switch unit 250.

The pull-up resistance unit 210 includes two pull-up termination resistance devices 211 and 212, and one switch 213. The first pull-up termination resistance device 211 is connected between a power terminal and the switch unit 250, and has a resistance value of 300Ω. The second pull-up termination resistance device 212 is connected in parallel to the first pull-up termination resistance device 211 and has a resistance value of 300Ω. Here, the pull-up termination resistance devices 211 and 212 can be embodied using a metal oxide semiconductor (MOS) transistor, etc.

The switch 213 is connected between a power terminal and the second pull-up termination resistance device 212, and is turned on or off in response to a pull-up control signal CU0. The pull-up resistance unit 210 can have the pull-up termination resistance value of 150Ω or 300Ω according to the on or off state of the switch 213. The pull-up resistance unit 210 has the pull-up termination resistance value of 300Ω when the switch 213 is off or open, and has the pull-up termination resistance value of 150Ω when the switch 213 is on or closed. Here, the pull up termination resistance value can have another resistance value in addition to 150Ω and 300Ω according to a resistance value of the pull-up termination resistance device.

The pull-down resistance unit 220 includes two pull-down termination resistance devices 221 and 222, and one switch 223. The first pull-down termination resistance device 221 is connected between a ground terminal and the switch unit 250. Referring to FIG. 2, an internal configuration of the pull-down resistance unit 220 is identical to that of the pull-up resistance unit 210. However, the configuration of the pull-down resistance unit 220 is not always identical to that of the pull-up resistance unit 210, and also can have a configuration different from that of the pull-up resistance unit 210. The pull-down resistance unit 220 can have the pull-down termination resistance value of 150Ω or 300Ω according to the on or off state of the switch 223.

The pull-up resistance controller 230 includes a low level detecting circuit 203. The low level detecting circuit 203 generates a high level output signal A0 when data DQ0 is in a level lower than a reference voltage Vref. Here, the reference voltage Vref is generated from a reference voltage generating circuit (not shown), and has a level lower than a power voltage Vcc. Additionally, the low level detecting circuit 203 generates a pull-up reset signal RU0 when a phase of the data DQ0 is changed from a low level to a high level.

The pull-up resistance controller 230 includes a number n of pull-up flip flops 231 to 23n connected in series with each other. The number n of pull-up flip flops 231 to 23n are reset by a pull-up reset signal RU0, and generate output signals A1 to An in synchronization with a transition of a clock signal CLK. The output signal An of the n pull-up flip flop 23n is a pull-up control signal CU0. The pull-up control signal CU0 is supplied to the switch 213 of the pull-up resistance unit 210. When the pull-up control signal CU0 is a high level, the switch 213 of the pull-up resistance unit 210 is on.

The pull-down resistance controller 240 includes a high level detecting circuit 204. The high level detecting circuit 204 generates a high level output signal B0 when data DQ0 is in a level higher than a reference voltage Vref. Additionally, the high level detecting circuit 204 generates a pull-down reset signal RD0 when a phase of the data DQ0 is changed from a high level to a low level. The pull-down resistance controller 240 includes the number n of pull-down flip flops 241 to 24n connected in serial to each other. The number n of pull-down flip flops 241 to 24n are reset by a pull-down reset signal RD0, and generates output signals B1 to Bn in synchronization with a transition of a clock signal CLK. The output signal Bn of the n pull-down flip flop 24n is a pull-down control signal CD0. The pull-down control signal CD0 is supplied to the switch 223 of the pull-down resistance unit 220.

Operations of the pull-up resistance controller 230 and the pull-down resistance controller 240 according to a phase change of the data DQ0 will be described in more detail with reference to FIGS. 3 through 5.

The switch unit 250 includes a positive channel MOS (PMOS) transistor 251, a negative channel MOS (NMOS) transistor 252, and an inverter 253.

The PMOS transistor 251 is connected between a pull-up resistance unit 210 and a node NO, and is turned on or off in response to a control signal ODT_ON supplied from a mode register EMRS. The NMOS transistor 252 is connected between the pull-down resistance unit 220 and the node NO, and is turned on or off in response to a control signal ODT_ON supplied from a mode register EMRS. The inverter 253 is connected to a gate of the PMOS transistor 251. The inverter 253 receives the control signal ODT_ON.

The switch unit 250 turns on or off the on die termination circuit 110 according to the control signal ODT_ON supplied from the mode register EMRS. The on die termination circuit 110 performs an on die termination operation when the control signal ODT_ON is in a high level, and does not perform the on die termination operation when the control signal ODT_ON is in a low level.

Figure 3:
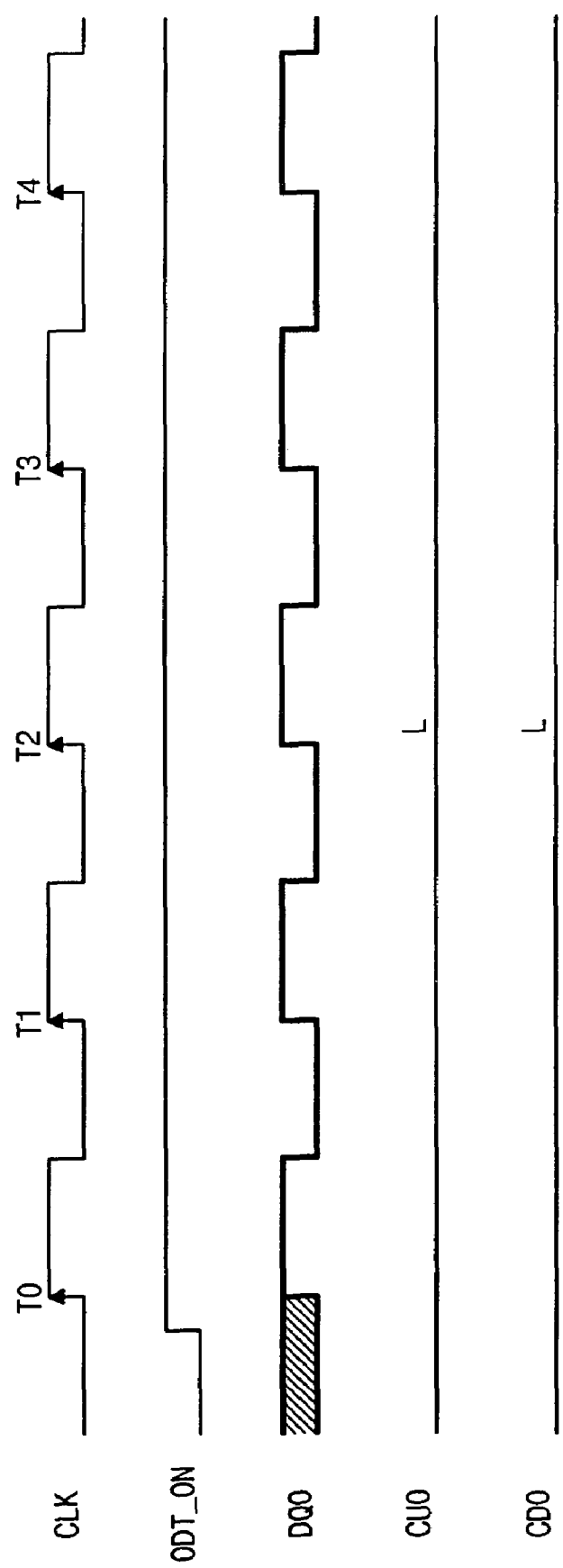
FIG. 3 is a timing diagram of waveforms when a level of data DQ0 is regularly changed.

FIG. 3 is a timing diagram illustrating waveforms of the pull-up control signal CU0 and the pull-down control signal CD0 when a level of data DQ0 is regularly changed. The waveforms of the pull-up control signal CU0 and the pull-down control signal CD0 are generated when a level of the data DQ0 is not identical during a predetermined period of the clock signal CLK.

Referring to FIG. 3, the pull-up control signal CU0 and the pull-down control signal CD0 always maintain a low level. The reason that the pull-up control signal CU0 maintains the low level is that a pull-up reset signal RU0 is generated when the data DQ0 level is changed from the low level to the high level. Additionally, the reason that the pull-down control signal CD0 maintains the low level is that a pull-down reset signal RD0 is generated when the data DQ0 level is changed from the low level to the high level.

Figure 4:
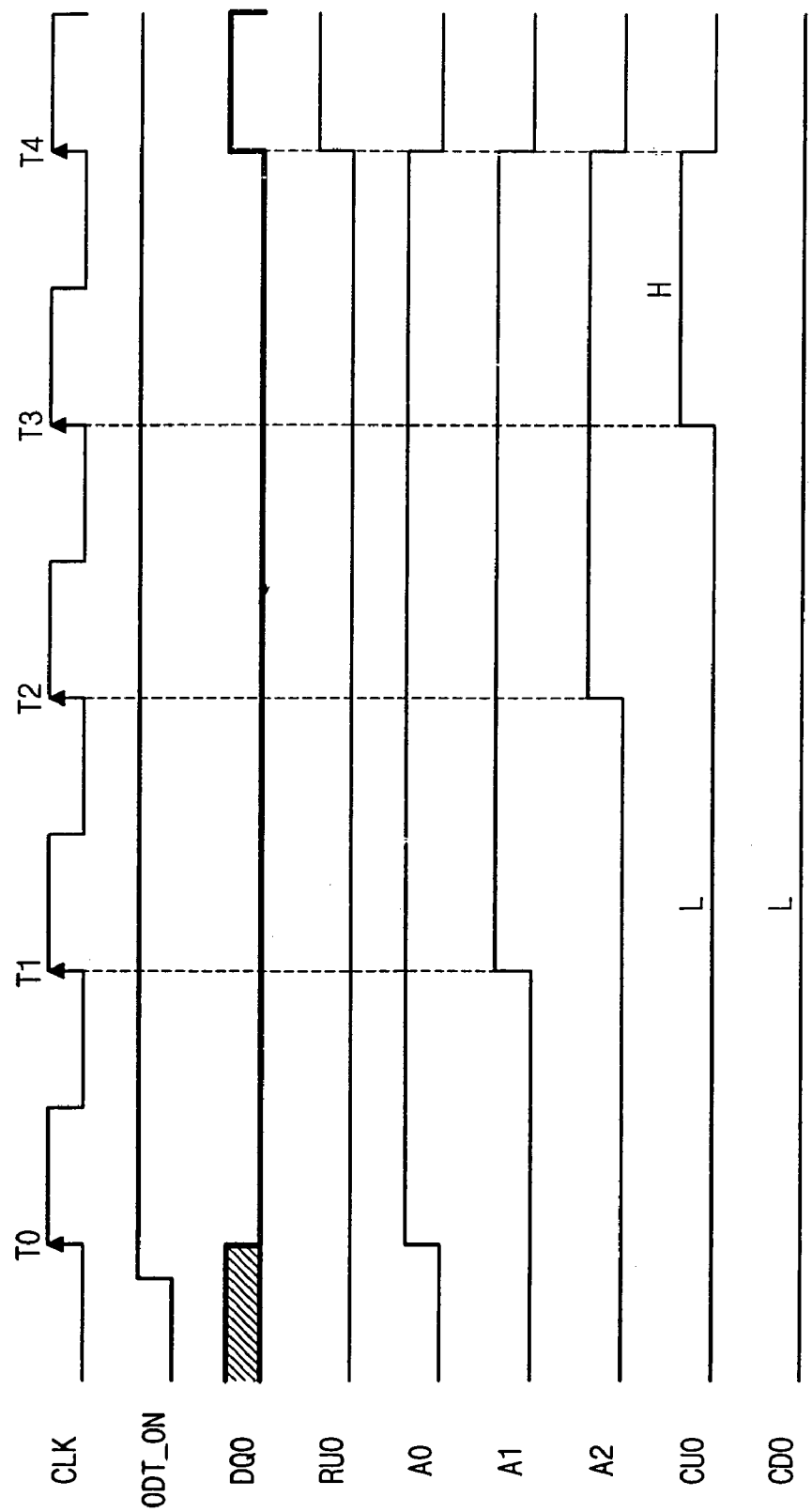
FIG. 4 is a timing diagram illustrating waveforms of a pull-up control signal CU0 and a pull-down control signal CD0 when data DQ0 maintains a low level during a predetermined period of a clock signal CLK.

FIG. 4 is a timing diagram illustrating waveforms of a pull-up control signal CU0 and a pull-down control signal CD0 when data DQ0 maintains a low level during a predetermined period of a clock signal CLK. Additionally, FIG. 4 illustrates that the pull-up control signal CU0 reaches a high level when the data DQ0 maintains a low level during three periods of the clock signal CLK.

In a T0 point, when it is assumed that the data DQ0 is in a low level, an output signal A0 of the low level detecting circuit 203 in FIG. 2 reaches a high level. In a T1 point, an output signal A1 of the flip flop 231 in FIG. 2 reaches a high level in synchronization with a transition of the clock signal CLK. In a T2 point, an output signal A2 of the flip flop 232 in FIG. 2 reaches a high level in synchronization with a transition of the clock signal CLK. Additionally, in a T3 point, an output signal A3 of the flip flop 233 in FIG. 2 reaches a high level in synchronization with a transition of the clock signal CLK. Here, the output signal A3 of the flip flop 233 is a pull up control signal CU0. At this point, the number of the flip flops in the pull-up resistance controller 230 is three.

When the data DQ0 is changed from a low level to a high level, the pull-up reset signal RU0 is generated. When the pull-up reset signal RU0 is generated, the output signals A0, A1, A2, and CU0 of the low level detecting circuit 203 and the flip flops 231, 232 and 233 reach a low level.

When the pull-up control signal CU0 is in a high level interval, the switch 213 of FIG. 2 is on. When the switch 213 is on, the pull-up termination resistance value of the pull-up resistance unit 210 is changed from 300 Ω to 150 Ω. When the pull-up termination value decreases, the ISI influence is less effective when the data DQ0 is changed from a low level to a high level. On the other hand, the pull-down control signal DC0 maintains a low level since the output signal B0 of the high level detecting circuit 204 maintains a low level when the data DQ0 is in a low level interval.

Figure 5:
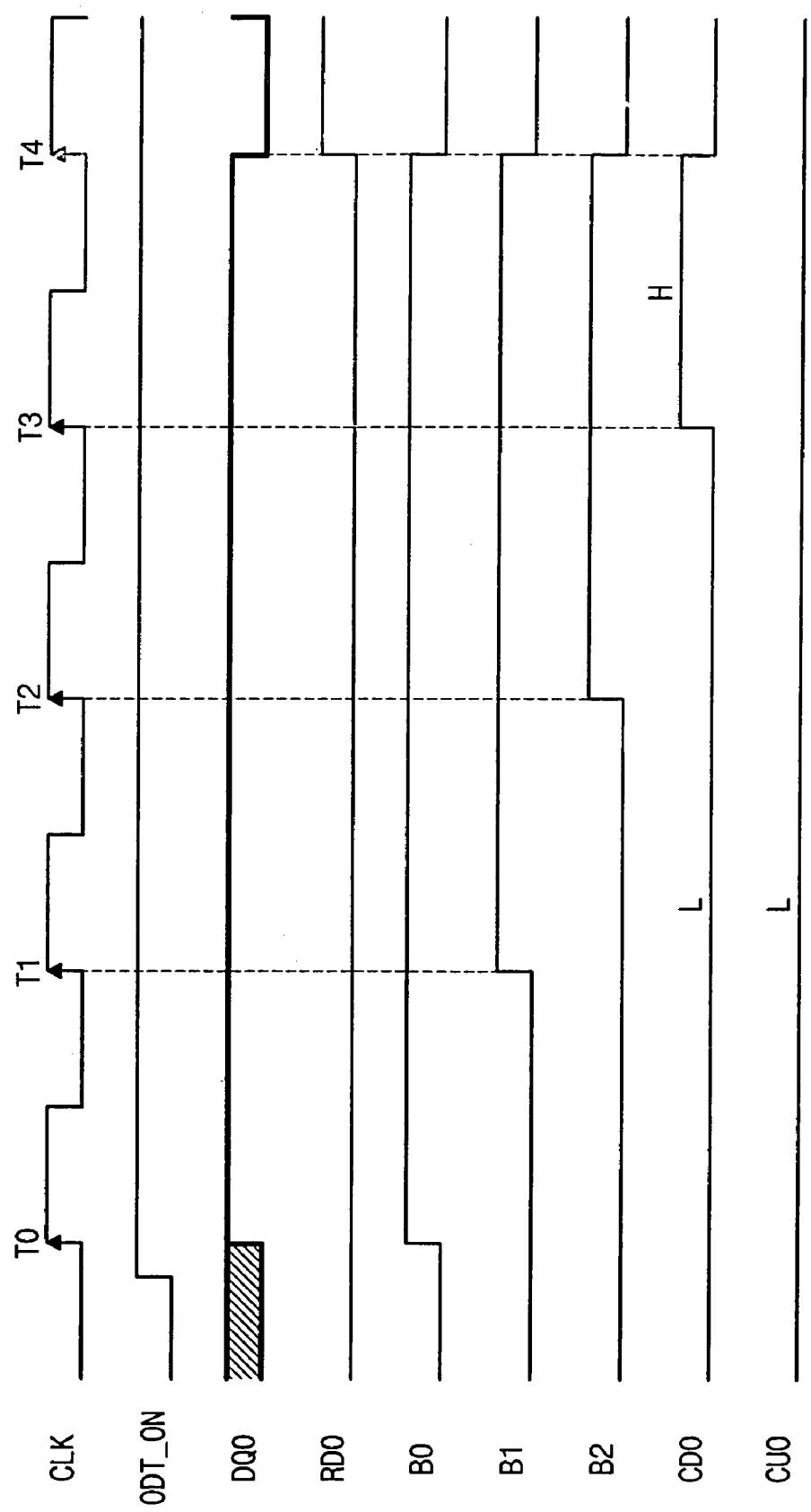
FIG. 5 is a timing diagram illustrating waveforms of a pull-up control signal CU0 and a pull-down control signal CD0 when data DQ0 maintains a high level during a predetermined period of a clock signal CLK.

FIG. 5 is a timing diagram illustrating waveforms of a pull-up control signal CU0 and a pull-down control signal CD0 when data DQ0 maintains a high level during a predetermined period of a clock signal CLK. FIG. 5 illustrates the pull-down control signal CD0 reaches a high level when the data DQ0 maintains a high level during three periods of a clock signal CLK.

In a T0 point, when it is assumed that the data DQ0 is in a high level, an output signal B0 of the high level detecting circuit 204 in FIG. 2 reaches a high level. Each of output signals B1, B2 and CD0 of the flip flops 241, 242 and 243 reaches a high level in synchronization with T1, T2 and T3 transition of the clock signal CLK. Additionally, when the data DQ0 is changed from a high level to a low level, the pull-down reset signal RD0 is generated. The high level detecting circuit 204 and the output signals B0, B1, B2 and CD0 of the flip flips 241, 242 and 243 reach a low level when the pull-down reset signal RD0 is generated.

The switch 223 in FIG. 2 is on when the pull-down control signal CD0 is in a high level interval. When the switch 223 is on, the pull-down termination resistance value of the pull-down resistance unit 220 is changed from 300Ω to 150Ω. When the pull-down termination value decreases, the ISI influence is less effective when the data DQ0 is changed from a low level to a high level. On the other hand, the pull-up control signal CU0 maintains a low level since the output signal A0 of the low level detecting circuit 203 maintains a low level when the data DQ0 is in a high level interval.

FIG. 6 is a graph illustrating a data window diagram. FIG. 6(a) is a graph illustrating a data window diagram of a semiconductor memory device having a conventional on die termination circuit. FIG. 6(b) is a graph illustrating a data window diagram of a semiconductor memory device having an on die termination circuit of the present invention. In FIGS. 6(a) and 6(b), when comparing area A with area B between 0.5 V and 1.25 V, it can be seen that the area B is larger than the area A. It means that the semiconductor memory device having the on die termination circuit of the present invention is less influenced by the ISI than the conventional semiconductor device.

The semiconductor memory device of the present invention includes the on die termination circuit that controls a termination resistance value according to a phase change of an input signal. An influence of the ISI can be minimized according to the present invention.

According to the present invention, since the semiconductor memory device includes an on die termination circuit that changes a termination resistance value according to a phase change of an input signal, the ISI influence can be reduced.

In the on die termination method, the ISI influence can be reduced because the termination resistance value is changed according to a phase change of the input signal.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor memory device comprising:
   a pad; and
   an on die termination circuit coupled to the pad and controlling a termination resistance value by monitoring a phase change of a signal inputted through the pad, wherein the on die termination circuit changes the termination resistance value when the signal inputted through the pad has an identical phase during n (n is positive integer) consecutive periods of a clock signal.

2. The semiconductor memory device of claim 1, wherein the pad is a data pad.

3. The semiconductor memory device of claim 1, wherein the on die termination circuit comprises a pull-up resistance unit having a pull-up termination resistance value and a pull-down resistance unit having a pull-down termination resistance value, and the pull-down termination resistance value and the pull-up termination resistance value can be controlled independently.

4. The semiconductor memory device of claim 3, wherein the on die termination circuit further comprises a pull-up resistance controller controlling the pull-up termination resistance value by monitoring the phase change of the signal, and a pull-down resistance controller controlling the pull-down termination resistance value by monitoring the phase change of the signal.

5. The semiconductor memory device of claim 4, wherein the pull-up resistance controller changes the pull-up termination resistance value when an identical phase signal is inputted during n (n is positive integer) periods of a clock signal.

6. The semiconductor memory device of claim 5, wherein the pull-up resistance controller reduces the pull-up termination resistance value when a low level signal is inputted during n (n is positive integer) periods of the clock signal.

7. The semiconductor memory device of claim 4, wherein the pull-down resistance controller changes the pull-down termination resistance value when an identical phase signal is inputted during n (n is positive integer) periods of a clock signal.

8. The semiconductor memory device of claim 7, wherein the pull-down resistance controller reduces the pull-down termination resistance value when a high level signal is inputted during n (n is positive integer) periods of the clock signal.

9. The semiconductor memory device of claim 1, wherein a period of the signal inputted is identical to the period of the clock signal.

10. The semiconductor memory device of claim 1, wherein the on die termination circuit is configured to control the termination resistance value to reduce intersymbol interference of the signal inputted through the pad.

11. A semiconductor memory device comprising:
    a plurality of pads; and
    a plurality of on die termination circuits coupled to the pads and controlling a termination resistance value independently by monitoring each phase change of signals inputted through the plurality of pads, wherein the on die termination circuits change the termination resistance value when a signal of the signals inputted through the pads has an identical phase during n (n is positive integer) consecutive periods of a clock signal.

12. The semiconductor memory device of claim 11, wherein the plurality of pads are a plurality of data pads.

13. The semiconductor memory device of claim 12, wherein each of the on die termination circuits comprises a pull-up resistance unit having a pull-up termination resistance value and a pull-down resistance unit having a pull-down termination resistance value, and the pull-up termination resistance value and the pull-down termination resistance value can be controlled independently.

14. The semiconductor memory device of claim 11, wherein the semiconductor memory device is a dynamic random access memory (DRAM) device.

15. The semiconductor memory device comprising:
    a plurality of pads, wherein the plurality of pads are a plurality of data pads; and
    a plurality of on die termination circuits controlling a terminal resistance value independently by monitoring each phase change of signals inputted through the plurality of pads, wherein each of the on die termination circuits comprises:
a pull-up resistance unit having a pull-up termination resistance value;
a pull-down resistance unit having a pull-down termination resistance value;
a switch unit connected between the pull-up resistance unit and the pull-down resistance unit to turn on or off the plurality of die termination circuits in response to a control signal ODT_ON supplied from a mode register;
a pull-up resistance controller controlling the pull-up termination resistance value by monitoring a phase change of data; and
a pull-down resistance controller controlling the pull-down termination resistance value by monitoring the phase change of the data.

16. The semiconductor memory device of claim 15, wherein the pull-up resistance controller changes the pull-up termination resistance value when a low level data is inputted during n (n is positive integer) periods of a clock signal.

17. The semiconductor memory device of claim 15, wherein the pull-down resistance controller changes the pull-down termination resistance value when a high level data is inputted during n (n is positive integer) periods of a clock signal.

18. An on die termination method of a semiconductor memory device, the method comprising:
monitoring a phase change of a signal inputted from a pad; and
controlling a termination resistance value of an on die termination circuit coupled to the pad, wherein the termination resistance value is changed when the signal inputted from the pad has an identical phase during n (n is positive integer) consecutive periods of a clock signal.

19. The method of claim 18, wherein the on die termination circuit comprises a pull-up termination resistance value and a pull-down termination resistance value, and the pull-up termination resistance value and the pull-down termination resistance value are controlled independently.

20. A semiconductor memory device comprising:
a pad; and
an on die termination circuit controlling a termination resistance value by monitoring a phase change of a signal inputted through the pad, wherein the on die termination circuit changes the termination resistance value when an identical phase signal is inputted during n (n is positive integer) periods of a clock signal, wherein the on die termination circuit comprises a pull-up resistance unit having a pull-up termination resistance value and a pull-down resistance unit having a pull-down termination resistance value, and the pull-up termination resistance value and the pull-down termination resistance value can be controlled independently, wherein the on die termination circuit further comprises a pull-up resistance controller controlling the pull-up termination resistance value by monitoring the phase change of the signal, and a pull-down resistance controller controlling the pull-down termination resistance value by monitoring the phase change of the signal, and wherein the on die termination circuit further comprises a switch unit turning on or off the die termination circuit in response to a control signal supplied from a mode register.

* * * * *